(12) United States Patent
Sun et al.

(10) Patent No.: US 10,062,834 B2
(45) Date of Patent: Aug. 28, 2018

(54) ELECTROMAGNETIC CONVERSION DEVICE AND INFORMATION MEMORY COMPRISING THE SAME

(71) Applicant: Institute of Physics, Chinese Academy of Sciences, Beijing (CN)

(72) Inventors: Yang Sun, Beijing (CN); Yisheng Chai, Beijing (CN); Dashan Shang, Beijing (CN)

(73) Assignee: INSTITUTE OF PHYSICS, CHINESE ACADEMY OF SCIENCES (CN)

( * ) Notice: Subject to any disclaimer, the term of this patent is extended or adjusted under 35 U.S.C. 154(b) by 0 days.

(21) Appl. No.: 15/548,204

(22) PCT Filed: Jan. 20, 2016

(86) PCT No.: PCT/CN2016/071447
§ 371 (c)(1),
(2) Date: Aug. 2, 2017

(87) PCT Pub. No.: WO2016/127768
PCT Pub. Date: Aug. 18, 2016

(65) Prior Publication Data
US 2018/0026177 A1    Jan. 25, 2018

(30) Foreign Application Priority Data

Feb. 13, 2015   (CN) .......................... 2015 1 0078540

(51) Int. Cl.
*G11C 11/22*   (2006.01)
*H01L 43/02*   (2006.01)
(Continued)

(52) U.S. Cl.
CPC .............. *H01L 43/02* (2013.01); *G11C 11/02* (2013.01); *G11C 11/22* (2013.01); *H01F 10/14* (2013.01);
(Continued)

(58) Field of Classification Search
CPC ........................... G11C 11/1675; G11C 11/22
(Continued)

(56) References Cited

U.S. PATENT DOCUMENTS 5,477,405 A * 12/1995 Okada ..................... G11B 5/115
                                                        360/121
6,071,605 A *  6/2000 Kudo ...................... G11B 5/738
                                                        428/323
(Continued)

FOREIGN PATENT DOCUMENTS

CN   101587936 A   11/2009
CN   101794601 A    8/2010
CN   104681710 A    6/2015

OTHER PUBLICATIONS

Shang Da-Shan, "Toward the complete relational graph of fundamental circuit elements", Chin. Phys. B vol. 24, No. 6, May 20, 2015, pp. 068402-1-068402-6, 16 pages.
(Continued)

*Primary Examiner* — Michael Tran
(74) *Attorney, Agent, or Firm* — Zhong Law, LLC

(57) ABSTRACT

The present invention provides an electromagnetic conversion device, comprising: an intermediate layer and electrode layers located on both sides of the intermediate layer, wherein the intermediate layer is a magnetoelectric layer. The electromagnetic conversion device realizes the direct conversion of charge and magnetic flux, and thus can be used as a fourth fundamental circuit element, so as to provide a new degree of freedom for the design of electronic
(Continued)

circuits and information function devices. In addition, the electromagnetic conversion device can be used as memory elements to form a nonvolatile magnetoelectric information memory.

10 Claims, 7 Drawing Sheets

(51) Int. Cl.
| | |
|---|---|
| H01L 29/82 | (2006.01) |
| H01L 41/02 | (2006.01) |
| H01L 41/083 | (2006.01) |
| G11C 11/02 | (2006.01) |
| H01F 10/14 | (2006.01) |
| H01F 10/16 | (2006.01) |
| H01L 41/187 | (2006.01) |
| H01L 41/20 | (2006.01) |
| H01L 43/10 | (2006.01) |

(52) U.S. Cl.
CPC ............ *H01F 10/16* (2013.01); *H01L 29/82* (2013.01); *H01L 41/02* (2013.01); *H01L 41/083* (2013.01); *H01L 41/1871* (2013.01); *H01L 41/1875* (2013.01); *H01L 41/20* (2013.01); *H01L 43/10* (2013.01)

(58) Field of Classification Search
USPC .................................................. 365/145, 158
See application file for complete search history.

(56) References Cited

U.S. PATENT DOCUMENTS

| | | | | |
|---|---|---|---|---|
| 6,946,938 | B1* | 9/2005 | Pedersen ............... | H02K 19/02 335/296 |
| 7,199,495 | B2* | 4/2007 | Or .......................... | H01L 41/16 310/26 |
| 7,952,349 | B2* | 5/2011 | Huang ................... | A61N 1/3787 324/109 |
| 8,836,329 | B2* | 9/2014 | Weinberg ........... | G01R 33/3852 324/307 |
| 8,908,422 | B2* | 12/2014 | Tiercelin ................ | G11C 11/14 365/157 |
| 9,184,496 | B2* | 11/2015 | Duwel .................... | H01Q 1/364 |
| 9,299,485 | B1* | 3/2016 | Katiyar .................. | G11C 11/15 |
| 9,340,902 | B2* | 5/2016 | Kim ......................... | H01F 1/10 |
| 9,383,417 | B2* | 7/2016 | Jahns ...................... | G01R 33/06 |
| 9,576,088 | B2* | 2/2017 | Nomura .............. | G06F 17/5018 |
| 9,853,053 | B2* | 12/2017 | Lupino ............. | H01L 27/11898 |
| 2004/0126620 | A1* | 7/2004 | Viehland ................ | G01R 33/02 360/328 |
| 2008/0211491 | A1* | 9/2008 | Huang .................. | A61N 1/3787 324/209 |
| 2009/0085695 | A1* | 4/2009 | Srinivasan ................ | H01P 1/19 333/219.2 |
| 2010/0032896 | A1* | 2/2010 | Berlec .................... | A63F 9/0402 273/146 |
| 2010/0102369 | A1* | 4/2010 | Tian ........................ | G11C 11/22 257/295 |
| 2010/0188773 | A1 | 7/2010 | Zavaliche et al. | |
| 2011/0162687 | A1* | 7/2011 | Moon ..................... | B82Y 10/00 136/244 |
| 2013/0163313 | A1* | 6/2013 | Tiercelin ................ | G11C 11/16 365/157 |
| 2013/0314765 | A1* | 11/2013 | Padilla .................... | G01K 7/003 359/315 |
| 2014/0125332 | A1* | 5/2014 | Lage ...................... | G01R 33/18 324/244 |
| 2016/0111072 | A1* | 4/2016 | Carman ................. | G10H 3/143 84/726 |
| 2016/0336375 | A1* | 11/2016 | Khalili Amiri ......... | H01L 43/08 |
| 2018/0026177 | A1* | 1/2018 | Sun ........................ | H01L 43/02 |

OTHER PUBLICATIONS

International Search Report for International Application No. PCT/CN2016/071447, dated Apr. 20, 2016, 4 pages.
Shipeng Shen et al.; Nonvolatile electric-field control of magnetization in a Y-type hexaferrite; vol. 5—Scientific Reports; Feb. 5, 2015; pp. 5.
Ying-Hao Chu et al.; Electric-field control of local ferromagnetism using a magnetoelectric multiferroic; vol. 7—Nature Materials, Apr. 27, 2008; pp. 5.
Sae Hwan Chun et al.; Realization of Giant Magnetoelectricity in Helimagnets; vol. 104—Physical Review Letters; Feb. 5, 2015; pp. 4.
Kunpeng Cai et al.; The research and application development of the fourth passive electronic memristor; Electronic Components and Materials; vol. 29 Issue 4; Apr. 30, 2010; pp. 10.
S. Zhang et al.; Electric-Field Control of Nonvolatile Magnetization in Co40Fe40B20/Pb(Mg1/3 nB2/3)0.7Ti0.3O3 Structure at Room Temperature; Physical Review Letters; vol. 108; Mar. 28, 2012; pp. 5.
V. Caignaert et al.; Gigantic magnetic-field-induced polarization and magnetoelectric coupling in a ferrimagnetic oxide CaBaCo4O7; Physical Review B; vol. 88 Issue 17; Nov. 5, 2013; pp. 5.
Chinese Office Action received in CN201510078540.6 dated Oct. 10, 2016, pp. 9.

* cited by examiner

ELECTROMAGNETIC CONVERSION DEVICE AND INFORMATION MEMORY COMPRISING THE SAME

CROSS-REFERENCE TO RELATED APPLICATIONS

This application claims priority to Chinese application No. 2015100785406, filed on Feb. 13, 2015, which is hereby incorporated by reference as though fully set forth herein.

TECHNICAL FIELD

The present invention belongs to the field of information technology and, more particularly, relates to an electromagnetic conversion device and an information memory comprising the same.

BACKGROUND OF THE INVENTION

According to the traditional circuit theories, resistors, capacitors and inductors are three fundamental circuit elements, wherein, the resistors are defined by the current-voltage conversion relationship, the capacitors are defined by the voltage-charge conversion relationship, and the inductors are defined by the current-magnetic flux conversion relationship. In 1971, Leon Chua of the University of California, USA proposed theoretically, based on the concept of symmetry, that there should be a fourth fundamental circuit element, which is defined by the conversion relationship between charge and magnetic flux (cf. Memristor—the missing circuit element, *IEEE Transactions on Circuit Theory;* Vol. 18, Pages 507-519, 1971) as shown in Formula (1). At that time, no physical example about charge-magnetic flux conversion was found, and thus Leon Chua took derivatives of both sides of Formula (1) with respect to time t and obtained Formula (2), and further obtained Formula (3). However, a circuit element M defined by Formula (3) is equivalent to a resistor R, and therefore is not meaningful. In order to make M different from conventional resistors, Leon Chua assumed that M can be a variable depending on charge q and time t, rather than a constant, and thus obtained Formula (4). In this case, a nonlinear resistive element, dubbed memristor, can be defined from Ohm's law as in Eq. (4).

$$d\varphi = M\,dq \quad (1)$$

$$\frac{d\varphi}{dt} = M\frac{dq}{dt} \quad (2)$$

$$v = Mi_{v=Mi} \quad (3)$$

$$v(t) = M(q(t))i(t) \quad (4)$$

Nearly 40 years after the proposal of this theory, researchers of Hewlett-Packard Company found that a simple Pt/TiO$_2$/Pt sandwich structure presents an i-v curve similar to that of a theoretically predicted memristor, and declared that a memristor was found experimentally (cf. The missing memristor found, D. B. Strukov, G. S. Snider, D. R. Stewart, R. S. Williams, Nature, Vol. 453, Pages 80-83, 2008).

Although the memristor has an important application prospect due to its non-linear memory function, it cannot be regarded as a true fourth fundamental circuit element. Firstly, the memristor does not satisfy the original definition of the fourth fundamental element (Formula (1)). In other words, the memristor is not defined directly by the conversion relationship between charge and magnetic flux. Secondly, the memristor is essentially a resistance device, with the operation and action thereof being completely independent of the magnetic flux, and having no magnetic flux memory function. Thirdly, the memristor as a non-linear device is unequal in status to the other three linear fundamental elements, resulting contradictions in fundamental circuit theories. Finally, since the memristor is essentially a resistance device, which has a high operation power consumption and is very different from ideal charge-magnetic flux conversion devices with low power consumption, the application thereof is very limited. Therefore, the fourth fundamental circuit element strictly satisfying the original definition for directly realizing charge-magnetic flux conversion is still missing.

SUMMARY OF INVENTION

In view of the foregoing, an object of the present invention is to provide an electromagnetic conversion device, comprising: an intermediate layer and electrode layers located on both sides of the intermediate layer, wherein the intermediate layer is a magnetoelectric layer.

Preferably, the magnetoelectric layer comprises a material having linear magnetoelectric effects, so as to form a linear transistor.

Preferably, the magnetoelectric layer with linear magnetoelectric effects comprises a single-crystal BaSrCoZnFe$_{11}$AlO$_{22}$, a single-phase material Cr$_2$O$_3$, a single-phase material BiFeO$_3$, a single-phase material NiSO$_4$.6H$_2$O, a composite material CoFeB/PMN-PT, or a composite material FeGaB/PZN-PT$_\circ$ Preferably, the magnetoelectric layer comprises a magnetoelectric material having a butterfly-shaped nonlinear hysteresis curve, so as to form a non-linear memtransistor.

Preferably, the magnetoelectric material having a butterfly-shaped nonlinear hysteresis curve is a single-phase magnetoelectric material or a ferromagnetic/ferroelectric composite material.

Preferably, the magnetoelectric material having a butterfly-shaped nonlinear hysteresis curve is a single-phase magnetoelectric material or a ferromagnetic/ferroelectric composite material.

Preferably, the single-phase magnetoelectric material having a butterfly-shaped nonlinear hysteresis curve is CaBaCo$_4$O$_7$, Ba$_{0.5}$Sr$_{1.5}$Co$_2$Fe$_{11}$AlO$_{22}$, Ba$_{0.5}$Sr$_{1.5}$Zn$_2$(Fe$_{0.92}$Al$_{0.08}$)$_{12}$O$_{22}$, BaFe$_{10.4}$Sc$_{1.6}$O$_{19}$, GaFeO$_3$ or Tb$_2$(MoO$_4$)$_{3\circ}$ Preferably, the ferromagnetic layer of the ferromagnetic/ferroelectric composite material having a butterfly-shaped nonlinear hysteresis curve is Tb$_{(1-x)}$Dy$_x$Fe$_{2-y}$ (0≤x≤1, y≤0.06), SmFe$_2$, Tb(CoFe)$_2$, Tb(NiFe)$_2$, TbFe$_3$, Pr$_2$Co$_{17}$, Ni$_{1-x}$Co$_x$ (0≤x≤1), Ni$_{1-x}$Fe$_x$ (0≤x≤1), Fe$_{1-x}$Co$_x$ (0≤x≤1), FeAl, FeCoV, FeGaB, CoFeB, Fe$_{80}$B$_{15}$Si$_5$, Fe$_{66}$Co$_{12}$B$_{14}$Si$_8$, Fe$_3$O$_4$, CoFe$_2$O$_4$ or NiFe$_2$O$_4$, and the ferroelectric layer thereof is (1−x)Pb(Mg$_{1/3}$Nb$_{2/3}$)O$_3$−xPbTiO$_3$ (0≤x≤1), (1−x)Pb(Zn$_{1/3}$Nb$_{2/3}$)O$_3$−xPbTiO$_3$ (0≤x≤1), Pb(Zr$_{1-x}$Ti$_x$)O$_3$ (0≤x≤1), (Ba$_{1-x}$Sr$_x$)TiO$_3$ (0≤x≤1), BiFeO$_3$, LiNbO$_3$, SrBi$_2$Ta$_2$O$_9$, Ba$_x$Sr$_{1-x}$Nb$_{10}$O$_{30}$ (0≤x≤1), Ba$_2$NaNb$_5$O$_{15}$, Potassium dihydrogen phosphate (KDP), polyvinylidene fluoride (PVDF), polytrifluoroethylene (PTrFE), bipolymer of polyvinylidene fluoride (PVDF) and polytrifluoroethylene (PTrFE), polyurethane or odd nylons.

Preferably, the intermediate layer is a sheet.

Preferably, the electrode layers are layers of a metal material.

Preferably, the metal material is silver, copper or gold.

Preferably, the electrode layers are layers of a non-metal materials with good conductivity.

The electromagnetic conversion device of the present invention realizes the direct conversion between charge and magnetic flux, and thus can be used as the fourth fundamental circuit element, so as to provide a new degree of freedom for the design of electronic circuits and information function devices. In addition, the electromagnetic conversion devices of the present invention comprise transistors and memtransistors depending on the materials of the intermediate magnetoelectric layers. The transistors are formed when the magnetoelectric layers are made of materials having linear magnetoelectric effects. And the memtransistors are formed when the magnetoelectric layers are made of magnetoelectric materials having butterfly-shaped nonlinear hysteresis curves. One of the significant advantages of memtransistors is that a new generation of nonvolatile memory can be implemented with very low power consumption. As the transistors and the memtransistors are composed of insulating magnetoelectric medium, which has a very small internal current as devices, the Joule loss is also very low. Compared with the current-driven resistance-type devices, the transistors and the memtransistors have a great advantage of low power consumption.

The present invention further provides a four-terminal device, comprising one inductor and one transistor of the present invention, wherein the transistor is in complete connection with the inductor in a magnetic circuit.

The present invention provides a further four-terminal device, comprising two transistors of the present invention, wherein the two transistors are in complete connection with each other in a magnetic circuit.

The present invention also provides an information memory, comprising an array of memory units comprising one or more memtransistors of the present invention, and further comprising a read coil surrounding the array of memory units. Preferably, the read coil is a metal solenoid.

The information memory has the following advantages: (1) high-speed read and write, ultra-low power consumption and infinite times to write; (2) the written data does not lose when power supply is terminated, i.e., it is non-volatile; (3) simple structure, which is beneficial to the realization of large-scale integration and high-density storage. Therefore, it has important applications in the field of information technology.

BRIEF DESCRIPTION OF DRAWINGS

The present invention will be further explained in combination with the embodiments with reference to the accompanying figures, wherein.

DESCRIPTION OF EMBODIMENTS

In the following parts, the present invention will be described in greater details with reference to the embodiments and the accompanying drawings so as to make its objects, solutions and advantages clearer. It should be understood that the specific embodiments described herein only intend to interpret the present invention, without making any limitation thereto.

Figure 1:
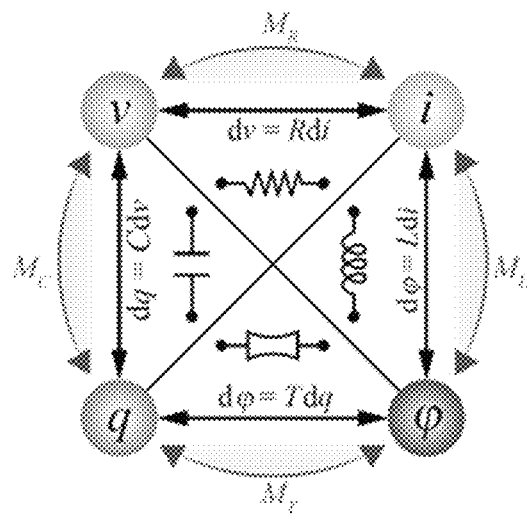
FIG. 1 is a schematic diagram of fundamental circuit elements comprising the fourth fundamental circuit element of the present invention.

The present invention proposes a device for realizing direct conversion between charge and magnetic flux using the magnetoelectric effects, which can function as the fourth fundamental circuit element satisfying the original definition. This device has linear response behavior as well as nonlinear response behavior, being referred to as a linear "transistor" and a nonlinear "memtransistor" (hereinafter to be referred to as a transistor and a memtransistor for short) respectively. Therefore, we can obtain a complete symmetrical diagram of the fundamental circuit elements (including four linear elements, i.e., resistors, capacitors, inductors and transistors, and four nonlinear elements, i.e., memristors, memcapacitors, meminductors and memtransistors), as shown in FIG. 1.

Figure 2A:
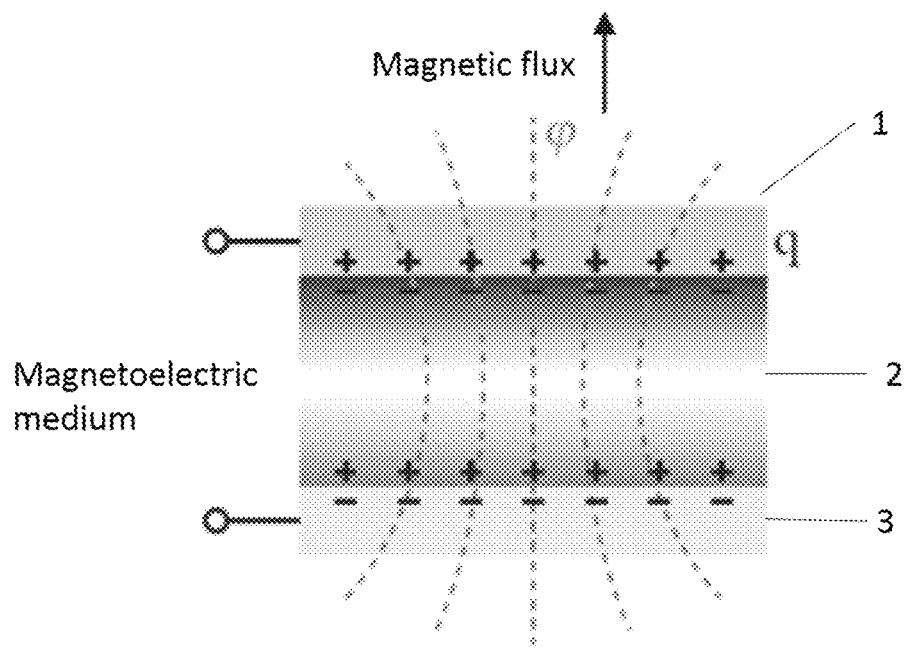
FIG. 2a is a work schematic of the longitudinal-type transistor device of the present invention.
Figure 2B:
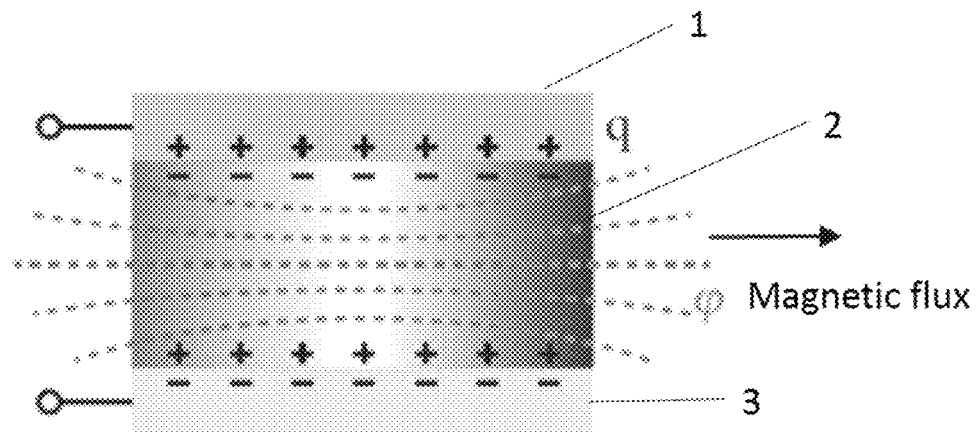
FIG. 2b is a work schematic of the transverse-type transistor device of the present invention.

As shown in FIGS. 2a and 2b, a transistor device of the present invention includes a magnetoelectric layer 2 and parallel electrode layers 1 and 3 located on both sides of the magnetoelectric layer 2. FIGS. 2a and 2b show operating principles of a longitudinal-type transistor device and a transverse-type transistor device according to the present invention, respectively. According to different magnetoelectric effects (transverse coupling or longitudinal coupling), the transistor device of the present invention includes a longitudinal-type (direction of electric field is parallel to direction of the magnetic flux, as shown in FIG. 2a) and a transverse-type (direction of electric field is perpendicular to direction of the magnetic flux, as shown in FIG. 2b). Based on Landau Theory (Electrodynamics of continuous media; L. D Landau, E. M. Lifshitz; Pergamon Press; 1980), the free energy of the magnetoelectric medium is shown in Formula (5):

$$-F(E,H) = \tfrac{1}{2}\varepsilon_o \chi_e E^2 + \tfrac{1}{2}\mu_o \chi_v H^2 + \alpha E H \qquad (5)$$

Wherein, $\varepsilon_0(\mu_0)$ and $\chi_e(\chi_\upsilon)$ are the permittivity (permeability) of vacuum and electric susceptibility (magnetic susceptibility) of the magnetoelectric medium, respectively, and $\alpha$ is the linear magnetoelectric coefficient of the magnetoelectric medium. Differentiating F(E,H) with respect to E and H leads to Eq. (6) and Eq. (7), respectively.

$$-dFdE = P = \varepsilon 0\chi eE + \alpha H - \frac{dF}{dE} = P = \varepsilon_0 \chi_e E + \alpha H - dFdE = \quad (6)$$
$$P = \varepsilon 0\chi eE + \alpha H - dFdE = P = \varepsilon 0\chi eE + \alpha H$$

$$-dFdH = \mu 0M = \alpha E + \mu 0\chi \upsilon H \quad (7)$$

For the longitudinal-type transistor device shown in FIG. 2a, the charges bound on the electrode layers 1 and 3 with an area of S are as shown in Eq. (8) while the magnetic flux passing through the magnetoelectric medium layer 2 is shown in Eq. (9):

$$q=DS=(\varepsilon_0 E+P)S=\varepsilon_0\varepsilon_r ES+\alpha HS \quad (8)$$

$$\varphi=BS=\mu_0(H+M)S=\alpha ES+\mu_0\mu_r HS \quad (9)$$

Wherein, $D=\varepsilon_0 E+P$ is the electric displacement in the magnetoelectric medium. $\varepsilon_r=\chi_e+1$ is the relative permittivity of the magnetoelectric medium. S is the surface area of the electrode layers. $B=\mu_o(H+M)$ is the magnetic flux density in the magnetoelectric medium. $\mu_r=\chi_\upsilon+1$ is the relative permeability of the magnetoelectric medium.

Under a constant external electric field, a change of magnetic flux $d\varphi$ may cause a change in magnetic field H by $dH=d\varphi/\mu_0\mu_r S$ (Eq. 9), consequently a change in the bound charges at electrodes by $dq=\alpha SdH$ (Eq. 8). In this case, a relationship between dq and $d\varphi$ is established as shown in Eq. (10):

$$dq = \frac{\alpha}{\mu_0\mu_r}d\varphi \quad d\varphi = \frac{\alpha}{\varepsilon_0\varepsilon_r}dq \quad (10)$$

In the case of a constant external magnetic field, a change in the bound charges at the electrodes dq may induce a change of magnetic flux $d\varphi$ due to the magnetoelectric effects. The relationship between the magnetic fluxes and the charges at this time can be obtained from Formulas (8) and (9), $$d\varphi = \frac{\alpha}{\varepsilon_0\varepsilon_r}dq \quad (11)$$
$$dq = \frac{\alpha}{\mu_0\mu_r}d\varphi$$
$$dq = \alpha\mu 0\mu rd\varphi dq = \alpha\mu 0\mu rd\varphi$$
$$dq = \alpha\mu 0\mu rd\varphi dq = \alpha\mu 0\mu rd\varphi$$

For the transverse-type transistor device shown in FIG. 2b, assuming that the area of the flank side of the magnetoelectric medium is S', the charges and the magnetic fluxes are as shown in Formulas (12) and (13), respectively:

$$q=DS=(\varepsilon_0 E+P)S=\varepsilon_0\varepsilon_r ES+\alpha HS \quad (12)$$

$$\varphi=BS=\mu_0(H+M)S'=\alpha ES+\mu_0\mu_r HS' \quad (13)$$

The parameters in the formulas are the same as before, except that area S associated with the magnetic fluxes is replaced by S' in Formula (13). Similarly, two direct relationships between dq and $d\varphi$ are established as shown in Formulas (14) and (15):

$$d\varphi = \frac{S'}{S}\frac{\alpha}{\varepsilon_0\varepsilon_r}dq \quad (14)$$

$$dq = \frac{S}{S'}\frac{\alpha}{\mu_0\mu_r}d\varphi \quad (15)$$

Figure 3:
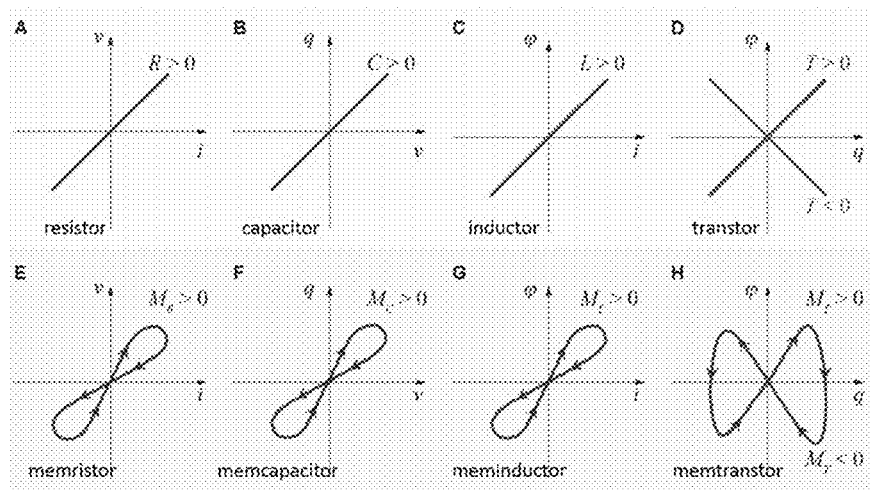
FIG. 3 shows circuit characteristic curves of the linear transistor and the nonlinear memtransistor according to the present invention.

It can be seen from the above derivation that the transistor device can directly realize mutual conversion between charges and magnetic fluxes, thus can satisfy the original definition of the fourth fundamental circuit element. We define the coefficient $\alpha/\varepsilon_0\varepsilon_r$ or $\alpha/\mu_0\mu_r$ relating the charges and the magnetic fluxes as a new physical quantity called "transtance." Since the magnetoelectric coefficient $\alpha$ can be either positive or negative, the value of transtance can also be either positive or negative, which is completely different from the other three fundamental circuit elements (resistors, capacitors, inductors). As shown in FIG. 3, wherein, A, B, C, and D respectively show an i-v relationship of the resistors, a v-q relationship of the capacitors, an i-$\varphi$ relationship of the inductors, and a q-$\varphi$ relationship of the transistors of the present invention. Therefore, the transistors cannot be obtained by the combination of the three fundamental elements of the resistors, the capacitors and the inductors.

There exist nonlinear memory devices corresponding to the resistors, capacitors and inductors, which are referred to as memresistors, memcapacitors and meminductors, respectively. Similarly, there are nonlinear memory devices corresponding to the transistors too, i.e., memtransistors. The nonlinear response behavior of the memtransistors is significantly different from the other three nonlinear memory devices and shows a unique butterfly-shaped nonlinear hysteresis curve, as shown in FIG. 3. Wherein, E, F, G and H respectively show an i-v relationship of the memresistors, a v-q relationship of the memcapacitors, an i-$\varphi$ relationship of the meminductors, and a q-$\varphi$ relationship of the memtransistors of the present invention.

Figure 4:
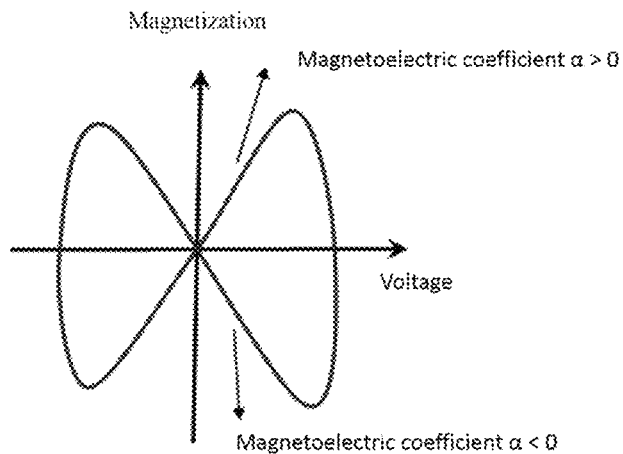
FIG. 4 is a schematic diagram of the nonlinear memtransistor of the present invention as an information memory.

The nonlinear behavior (q-$\varphi$ relationship) of the memtransistors shows a nonlinear hysteresis behavior having a butterfly shape. It can be seen from the above Formulas (8) and (9) that the change of magnetization M with the applied electric field E (or voltage V) corresponds to the q-$\varphi$ relationship, and also shows a butterfly-shaped nonlinear hysteresis curve, as shown in FIG. 4. In this case, the magnetoelectric coefficient $\alpha=dM/dE$ (i.e., slope of the M-E curve) can be either positive or negative, and switches between positive and negative with the change of voltage. Therefore, we can define positive $\alpha$ as data 0 and negative $\alpha$ as data 1. In the low-field region, the sign of $\alpha$ does not change with external fields. After a high field above the critical field is applied, $\alpha$ inverts its sign and retains the last state even if the applied voltage is removed. Therefore, the memtransistors of the present invention can be used as information memories and to realize nonvolatile storage.

Thus, based on the nonlinear magnetoelectric effects, the nonvolatile storage of data can be realized by using states (positive and negative) of the magnetoelectric coefficient $\alpha$ as binary data (0 and 1). Data reads can be converted into measurement of the magnetoelectric coefficient $\alpha$, which can be done in the following two ways:

(1) A Static Method of Measuring the Magnetoelectric Coefficient.

According to the definition of the magnetoelectric coefficient, $\alpha = dM/dE \approx dP/dH$. When a small DC magnetic field H is applied on the magnetoelectric medium, a change of electric polarization $\Delta P$ is generated and then a small DC voltage V is generated. Therefore, the value and sign of $\alpha$ can be calculated by measuring the DC voltage V induced by the magnetoelectric effect.

(2) A Dynamic Method of Measuring the Magnetoelectric Coefficient.

When a small AC magnetic field H is applied on the magnetoelectric medium, an AC voltage with the same frequency is generated. The value and phase of the AC voltage are measured by a lock-in amplifier, so as to calculate the value and sign of the magnetoelectric coefficient. Since the applied magnetic field is small and the resulted voltage is low, the read operation would not destroy the memory state.

Hereinafter, transistors, memtransistors, four-terminal devices comprising transistors, and magnetoelectric information memories comprising memtransistors of the present invention will be described with reference to specific examples.

The First Embodiment

Figure 5:
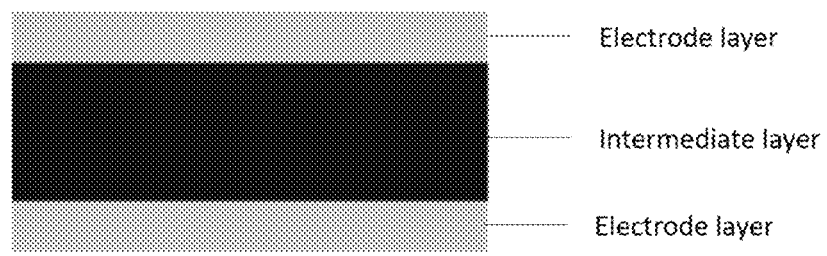
FIG. 5 is a structural diagram of the electromagnetic conversion device of the present invention.
Figure 6:
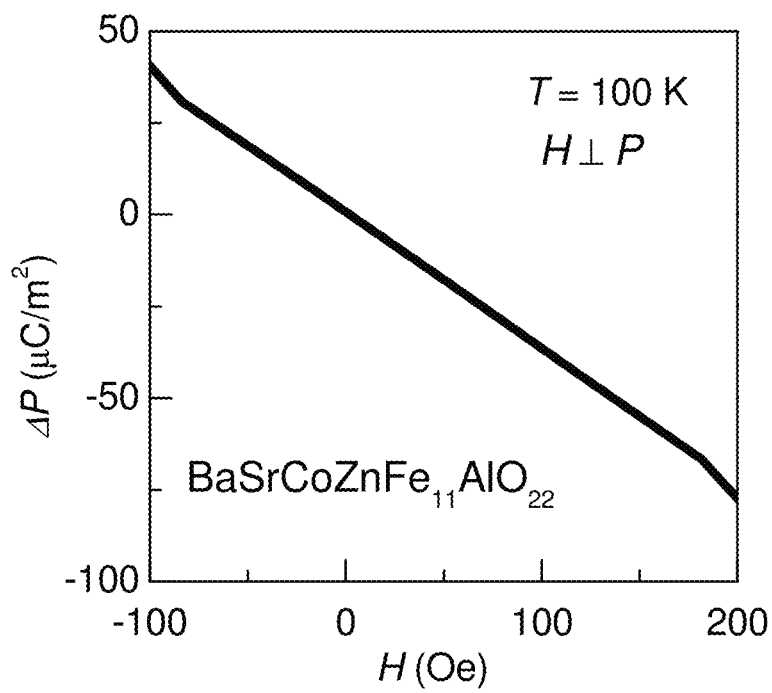
FIG. 6 shows performance measurements of the linear transistor of the present invention.

FIG. 5 shows the structure of a linear transistor according to the present invention, comprising: an intermediate single-crystal $BaSrCoZnFe_{11}AlO_{22}$ layer and Ag electrode layers located on both sides of the intermediate single-crystal $BaSrCoZnFe_{11}AlO_{22}$ layer. The single-crystal $BaSrCoZnFe_{11}AlO_{22}$ layer is a sheet layer with a length, a width and a thickness of 2 mm, 2 mm and 0.3 mm, and with the large surface being (001) plane. The changing of electric polarization $\Delta P$ as a function of applied magnetic field H of the linear transistor device of this embodiment is characterized by magnetoelectric current measurements, which are carried out in a Physical Property Measurement System (PPMS), manufactured by Quantum Design Inc., wherein, the measuring temperature is 100 K and the magnetic field H is swept from −100 Oe to 200 Oe continuously. The magnetoelectric current is measured by the Keithley 6517B electrometer and the change of polarization is obtained by integrating the current with time. From the $\Delta P$-H relationship curve shown in FIG. 6 (it is readily understood by those skilled in the art that the $\Delta P$-H relationship reflects the relationship between charges and magnetic fluxes), it can be seen that the electric polarization changes linearly with the applied magnetic field when the device is driven by the magnetic field, and the conversion slope is negative, indicating that there is a linear conversion relationship between the charges and the magnetic fluxes, which is the behavior of a typical linear transistor.

The Second Embodiment

Figure 7:
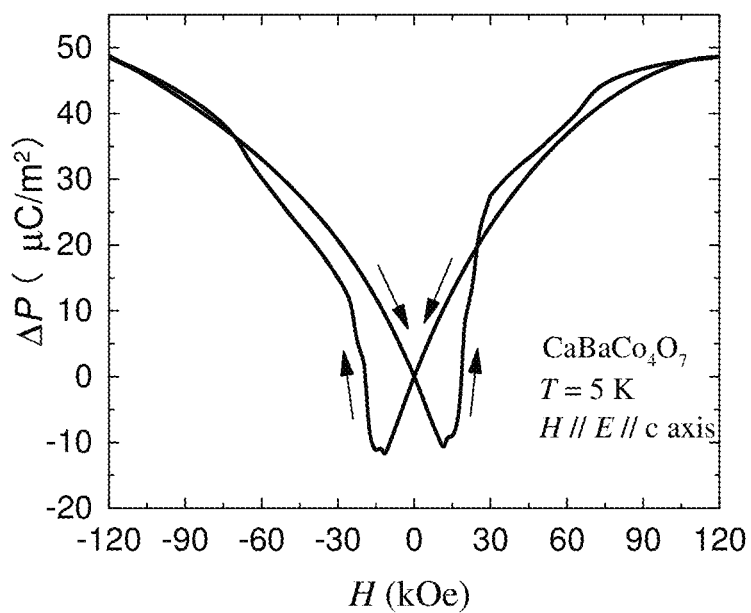
FIG. 7 shows performance measurements of the nonlinear memtransistor according to the second embodiment of the present invention.

The structure of a nonlinear memtransistor according to the second embodiment of the present invention is similar to that of the linear transistor of the first embodiment, but with a difference that the intermediate layer is a single-crystal $CaBaCo_4O_7$ layer. The single-crystal $CaBaCo_4O_7$ layer is a sheet layer with the length, width and thickness of 2 mm, 1 mm and 0.4 mm, respectively, and with the large surface being (001) plane. The changing of electric polarization $\Delta P$ as a function of applied magnetic field H of the nonlinear memtransistor of this embodiment is characterized by the magnetoelectric current measurements which are carried out in a Physical Property Measurement System (PPMS) manufactured by Quantum Design Inc., wherein, the measuring temperature is 5 K, the scanning magnetic field during the measurement is in the range of −120 kOe~+120 kOe, and the change in charges at the electrodes on both ends is measured by the Keithley 6517B electrometer. From the $\Delta P$-H relationship curve shown in FIG. 7 (two curves in FIG. 7 correspond to H-increase and H-decrease scans respectively), it can be seen that when the device is driven by a magnetic field perpendicular to the electrode plane, the electric polarization changes differently between H-increase and H-decrease scans. Then, $\Delta P$-H curve exhibits a butterfly-shaped nonlinear hysteresis behavior with a slope change between positive and negative at zero magnetic field. It can be seen that there is a butterfly-shaped nonlinear relationship between the charge and the magnetic flux and thus the device has the expected behavior of a typical nonlinear memtransistor.

The Third Embodiment

Figure 8:
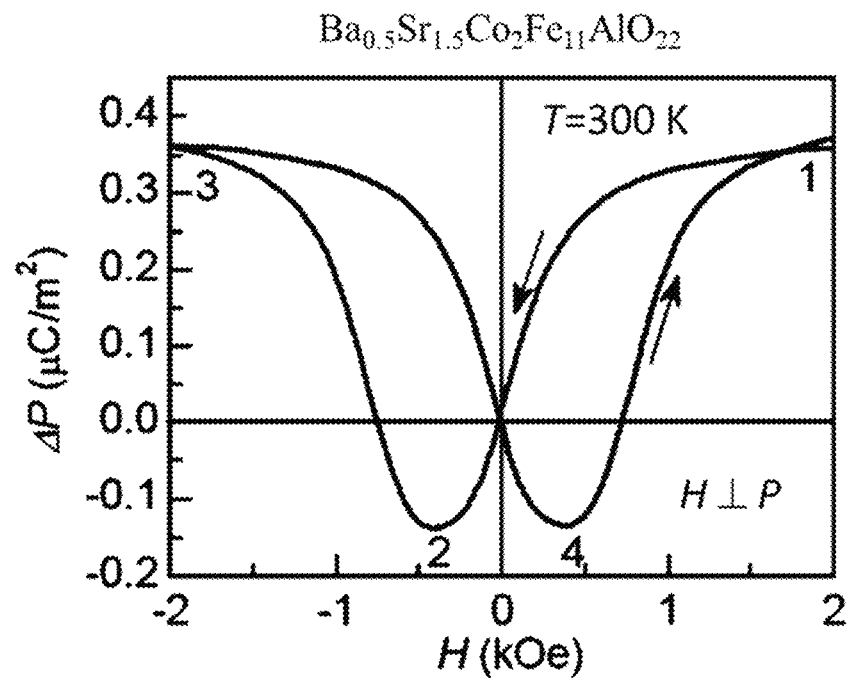
FIG. 8 shows performance measurements of the nonlinear memtransistor according to the third embodiment of the present invention.

The structure of a nonlinear memtransistor according to the third embodiment of the present invention is similar to that of the linear transistor of the first embodiment, with a difference that the intermediate layer is a single-crystal $Ba_{0.5}Sr_{1.5}Co_2Fe_{11}AlO_{22}$ layer. The single-crystal $Ba_{0.5}Sr_{1.5}Co_2Fe_{11}AlO_{22}$ layer is a sheet layer with the length, width and thickness of 2.36 mm, 2.36 mm and 0.39 mm, respectively, and with the large surface being (001) plane. The changing of electric polarization $\Delta P$ as a function of applied magnetic field H of the nonlinear memtransistor of this embodiment is characterized by the magnetoelectric current measurements which are carried out in a Physical Property Measurement System (PPMS) manufactured by Quantum Design Inc., wherein, the measuring temperature is 300 K, the scanning magnetic field during the measurement is in the range of −2000 Oe~+2000 Oe, and the change in charges at the electrodes on both ends is measured by the Keithley 6517B electrometer. From the $\Delta P$-H relationship curve shown in FIG. 8 (two curves in FIG. 8 correspond to H-increase and H-decrease scans respectively), it can be seen that when the device is driven by a magnetic field perpendicular to the electrode plane, the electric polarization changes differently between H-increase and H-decrease scans. Then, $\Delta P$-H curve exhibits a butterfly-shaped nonlinear hysteresis behavior with a slope change between positive and negative at zero magnetic field. It can be seen that there is a butterfly-shaped nonlinear relationship between the charge and the magnetic flux and thus the device has the expected behavior of a typical nonlinear memtransistor. In addition, the butterfly-shaped nonlinear hysteresis behavior of the memtransistor according to this embodiment is more regular, the magnetic field needed during measurement is smaller, and the work temperature is at room.

The Fourth Embodiment

Figure 9A:
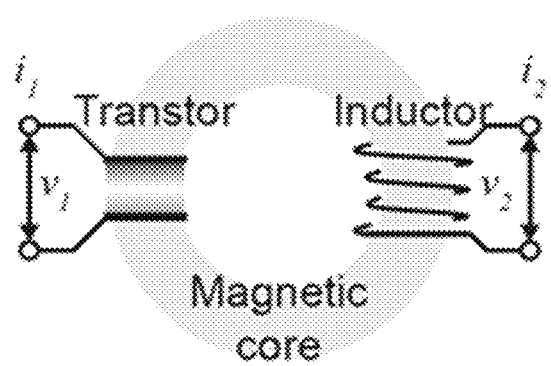
FIGS. 9a and 9b are schematic diagrams of the four-terminal devices of the present invention.
Figure 9B:
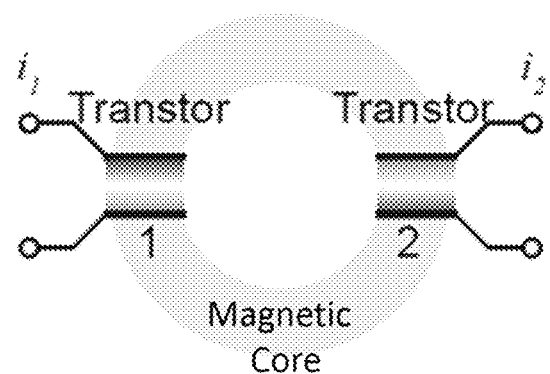

In this embodiment, the transistor of the first embodiment is combined with other elements to form a novel device. As shown in FIG. 9a, one transistor is in complete connection with one inductor in a magnetic circuit via a magnetic core (it is well known to those skilled in the art that the magnetic core has a function of constraining the magnetic fluxes, and the magnetic circuit is the circuit of the close magnetic flux lines along the magnetic core) so as to form a new four-terminal device with an anti-reciprocal voltage-current relationship: $v_1=-gi_2$ and $v_2=gi_1$, which is similar to the behavior of a gyrator, wherein g is the gyrator coefficient (in ohms). As shown in FIG. 9b, two transistors are in complete connection with each other in a magnetic circuit via a magnetic core so as to form a new four-terminal device with relationship equations $i_2=(T_1/T_2)i_1$ and $i_1=(T_2/T_1)i_2$, wherein $T_1$ and $T_2$ are transtances of transistors 1 and 2, respectively. The above current conversion relationship is completely different from the characteristics of transformers and gyrators. Therefore, the device is a new type of four-terminal circuit device.

The Fifth Embodiment

FIG. 10(a) is a view of the memtransistor of the present invention function as an information memory, which is based on the nonlinear magnetoelectric effects of a ferromagnetic/ferroelectric heterostructure with a magnetostrictive effect of ferromagnetic material and a piezoelectric effect of ferroelectric material. The ferromagnetic layer is made of a polycrystalline Terfenol-D ($Tb_{0.3}Dy_{0.7}Fe_2$) sheet with a relatively large magnetostrictive coefficient and a thickness of 1 mm. The ferroelectric layer is a single-crystal $0.7Pb(Mg_{1/3}Nb_{2/3})O_3$-$0.3PbTiO_3$ (PMN-PT) sheet with a thickness of 0.5 mm and a device area of 5 mm×5 mm. The ferromagnetic layer and the ferroelectric layer are bonded together by silver glue, and the upper and lower surfaces are covered with a layer of Ag electrode respectively.

Firstly, the changing of the magnetization as a function of the applied voltage (electric field) of the sample at room temperature is measured using a magnetic property measurement system (MPMS) manufactured by Quantum Design Inc. It can be seen from the measurement results shown in FIG. 10(b) that the in-plane magnetization of the device exhibits a butterfly-shaped nonlinear hysteresis curve with the applied voltage (electric field). This is due to the reversal of the ferroelectric polarization near coercive field (E=±2 kV/cm). Meanwhile the magnetoelectric coefficient $\alpha=\mu_0 dM/dE$ changes from positive to negative or from negative to positive accordingly. By defining $\alpha>0$ as the binary data 0, and $\alpha<0$ as the binary data 1, the device can be used as a magnetoelectric nonvolatile memory of the present invention.

Figure 10:
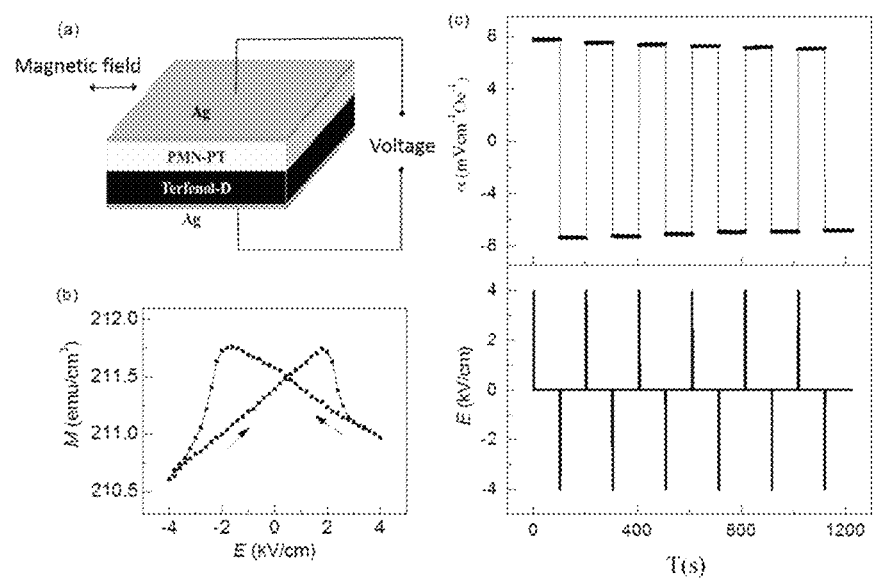
FIG. 10(a) is a structural diagram of the nonlinear memtransistor according to the present invention as a magnetoelectric information memory.
FIG. 10(b) shows the in-plane magnetization as a function of the applied electric field of the magnetoelectric information memory shown in FIG. 10(a).
FIG. 10(c) shows the repeatable switch of the magnetoelectric coefficient with the applied electric field of the magnetoelectric information memory shown in FIG. 10(a).

The device is placed in a read coil (solenoid) to test the nonvolatile memory performance thereof. An AC current of 100 kHz and 2 mA is outputted from a DC/AC sourcemeter (Keithley 6221), producing an AC magnetic field of 1.2 Oe in the solenoid. Due to the presence of the magnetoelectric effect, the AC magnetic field may induce an AC voltage of the same frequency between the upper and lower electrodes of the device. By using the lock-in amplifier (Stanford Research System, Model SR830) to detect the amplitude and phase of the AC voltage, the magnitude and sign of the magnetoelectric voltage coefficient $\alpha=dE/dH$ can be calculated. A positive or negative pulse voltage is applied between the Ag electrodes on both sides by a sourcemeter (Keithley 6517B) to change the direction of the ferroelectric polarization, and then change the sign of α. FIG. 10 (c) shows the response of the magnetoelectric voltage coefficient α to the applied electric field pulse over time. When a positive voltage (electric field) is applied, the α is positive and remains positive over time. Thereafter, when a negative voltage (electric field) is applied, α changes from positive to negative and remains negative over time. The switching processes can be repeated multiple times without significant decay. These experimental results successfully demonstrate the nonvolatile memory of the present invention.

The Sixth Embodiment

Figure 11:
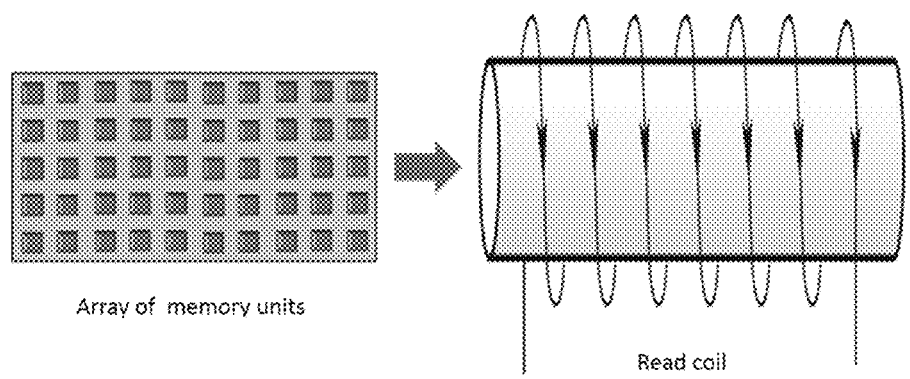
FIG. 11 shows the schematic diagram of the magnetoelectric information memory comprising an array of memtransistors and a read coil of the present invention.

The present embodiment provides an information memory comprising an array of memtransistors and a read coil surrounding the array of memtransistors, as shown in FIG. 11. The memtransistors are used as memory elements. The read coil includes a metal solenoid for generating a small DC or AC magnetic field. All memory elements can share one read coil. The metal electrodes at both ends of each memtransistor are used to apply voltage pulses to write data, as well as to measure a small voltage generated by the magnetoelectric effect to read the data. Therefore, the read circuits and write circuits are combined together, which greatly simplifies the structure of the memory. The preparation of the memtransistor array may be carried out by using a method known in the art, for example, preparing a large area film and then fabricate it into millions of elements by nanotechnology to form an array.

According to other embodiments of the present invention, the intermediate layer of the electromagnetic conversion device may employ other magnetoelectric media known in the art. The intermediate layer of the linear transistor may employ materials with linear magnetoelectric effects known in the art such as, for example, single-phase materials such as $Cr_2O_3$, $BiFeO_3$ and $NiSO_4 \cdot 6H_2O$, and composite materials such as, for example, CoFeB/PMN-PT and FeGaB/PZN-PT. The intermediate layer of the nonlinear mentransor may employ magnetoelectric materials having butterfly-shaped nonlinear hysteresis curves known in the art, comprising single-phase magnetoelectric materials or ferromagnetic/ferroelectric composite heterostructures. Examples of the single-phase magnetoelectric materials are $Ba_{0.3}Sr_{1.7}Co_2Fe_{11}AlO_{22}$, $Ba_{0.5}Sr_{1.5}Zn_2(Fe_{0.92}Al_{0.08})_{12}O_{22}$, $BaFe_{10.4}Sc_6O_{19}$, $CaBaCo_4O_7$, $GaFeO_3$ or $Tb_2(MoO_4)_3$. Examples of ferromagnetic layers of the ferromagnetic/ferroelectric composite heterostructures are $Tb_{(1-x)}Dy_xFe_{2-y}$ (0≤x≤1, y≤0.06), $SmFe_2$, $Tb(CoFe)_2$, $Tb(NiFe)_2$, $TbFe_3$, $Pr_2Co_{17}$, $Ni_{1-x}Co_x$ (0≤x≤1), $Ni_{1-x}Fe_x$ (0≤x≤1), $Fe_{1-x}Co_x$ (0≤x≤1), FeAl, FeCoV, FeGaB, CoFeB, $Fe_{80}B_{15}Si_5$, $Fe_{66}Co_{12}B_{14}Si_8$, $Fe_3O_4$, $CoFe_2O_4$ or $NiFe_2O_4$. And examples of ferroelectric layers of ferromagnetic/ferroelectric composite heterostructures are $(1-x)Pb(Mg_{1/3}Nb_{2/3})O_3-xPbTiO_3$ (0≤x≤1), $(1-x)Pb(Zn_{1/3}Nb_{2/3})O_3-xPbTiO_3$ (0≤x≤1), $Pb(Zr_{1-x}Ti_x)O_3$ (0≤x≤1), $(Ba_{1-x}Sr_x)TiO_3$ (0≤x≤1), $BiFeO_3$, $LiNbO_3$, $SrBi_2Ta_2O_9$, $Ba_xSr_{1-x}Nb_{10}O_{30}$ (0≤x≤1), $Ba_2NaNb_5O_{15}$, Potassium dihydrogen phosphate (KDP), polyvinylidene fluoride (PVDF), polytrifluoroethylene (PTrFE), bipolymer of polyvinylidene fluoride (PVDF) and polytrifluoroethylene (PTrFE), polyurethane or odd nylons. In addition, it may be readily appreciated by those skilled in the art that the magnetoelectric effect of certain magnetoelectric media may change from linear to nonlinear as the applied electric field increases.

According to other embodiments of the present invention, the intermediate layer of the electromagnetic conversion device is in a cubical shape.

According to other embodiments of the present invention, the electrode layers of the electromagnetic conversion device may employ any other electrode materials well known in the art, comprising metal materials and non-metal materials with good conductivity, such as copper, gold, conductive oxides, or graphite.

According to other embodiments of the present invention, the electrode layers of the electromagnetic conversion device cover part of the intermediate layer.

According to other embodiments of the present invention, for the nonlinear memtransistor function as an information memory, the intermediate layer is preferably a ferromagnetic/ferroelectric composite heterostructure, and both the thickness of the ferromagnetic layer and the thickness of the ferroelectric layer are in the range of 10 nm to 1 mm.

Although a number of specific dimensions of the magnetoelectric layers of the transistors and memtransistors of the present invention are given in the embodiments, it may be readily appreciated to those skilled in the art that the thickness of the magnetoelectric layers may be set based on the particular requirements of the magnetic fluxes in practical applications. For example, the thickness of the magnetoelectric layers should be less than 1 mm if the memtransistors are used as information memories. When applying the transistors to the four-terminal device, it is usually required that the magnetoelectric media have a relatively large magnetic flux and its thickness can range from 1 mm to 10 cm.

While the present invention has been described by way of preferred embodiments, it is not intended to limit the invention to the embodiments described herein and that various changes and modifications may be made without departing from the scope of the invention.

The invention claimed is:

1. An electromagnetic conversion device, comprising: an intermediate layer and electrode layers located on both sides of the intermediate layer, wherein the intermediate layer is a magnetoelectric layer comprising at least one magnetoelectric material associated with a butterfly-shaped nonlinear hysteresis curve of a q-φ relationship, wherein q represents charges, and φ represents magnetic fluxes.

2. The electromagnetic conversion device according to claim 1, wherein the at least one magnetoelectric material associated with the butterfly-shaped nonlinear hysteresis curve of the q-φ relationship is at least one of a single-phase magnetoelectric material or a ferromagnetic/ferroelectric composite material.

3. The electromagnetic conversion device according to claim 2, wherein the single-phase magnetoelectric material is at least one of $CaBaCo_4O_7$, $Ba_{0.5}Sr_{1.5}Co_2Fe_{11}AlO_{22}$, $Ba_{0.5}Sr_{1.5}Zn_2(Fe_{0.92}Al_{0.08})_{12}O_{22}$, $BaFe_{10.4}Sc_{1.6}O_{19}$, $GaFeO_3$, or $Tb_2(MoO_4)_3$.

4. The electromagnetic conversion device according to claim 2, wherein a ferromagnetic layer of the ferromagnetic/ferroelectric composite material is at least one of $Tb_{(1-x)}Dy_xFe_{2-y}$ ($0 \leq x \leq 1$, $y \leq 0.06$), $SmFe_2$, $Tb(CoFe)_2$, $Tb(NiFe)_2$, $TbFe_3$, $Pr_2Co_{17}$, $Ni_{1-x}Co_x$ ($0 \leq x \leq 1$), $Ni_{1-x}Fe_x$ ($0 \leq x \leq 1$), $Fe_{1-x}Co_x$ ($0 \leq x \leq 1$), FeAl, FeCoV, FeGaB, CoFeB, $Fe_{80}B_{15}Si_5$, $Fe_{66}Co_{12}B_{14}Si_8$, $Fe_3O_4$, $CoFe_2O_4$ or $NiFe_2O_4$, and a ferroelectric layer of the ferromagnetic/ferroelectric composite material is $(1-x)Pb(Mg_{1/3}Nb_{2/3})O_3-xPbTiO_3$ ($0 \leq x \leq 1$), $(1-x)Pb(Zn_{1/3}Nb_{2/3})O_3-xPbTiO_3$ ($0 \leq x \leq 1$), $Pb(Zr_{1-x}Ti_x)O_3$ ($0 \leq x \leq 1$), $(Ba_{1-x}Sr_x)TiO_3$ ($0 \leq x \leq 1$), $BiFeO_3$, $LiNbO_3$, $SrBi_2Ta_2O_9$, $Ba_xSr_{1-x}Nb_{10}O_{30}$ ($0 \leq x \leq 1$), $Ba_2NaNb_5O_{15}$, Potassium dihydrogen phosphate (KDP), polyvinylidene fluoride (PVDF), polytrifluoroethylene (PTrFE), bipolymer of polyvinylidene fluoride (PVDF) and polytrifluoroethylene (PTrFE), polyurethane, or odd nylons.

5. The electromagnetic conversion device according to claim 1, wherein the intermediate layer is a sheet.

6. The electromagnetic conversion device according to claim 1, wherein the electrode layers comprise layers of a metal material.

7. The electromagnetic conversion device according to claim 6, wherein the metal material is one of silver, copper, or gold.

8. The electromagnetic conversion device according to claim 1, wherein the electrode layers comprise layers of a non-metal material with good conductivity.

9. An information memory, comprising an array of memory elements comprising one or more electromagnetic conversion devices according to claim 1, and further comprising a read coil surrounding the array of memory elements.

10. The information memory according to claim 9, wherein the read coil is a metal solenoid.

* * * * *